US012690153B2

(12) United States Patent
Sunder et al.

(10) Patent No.: US 12,690,153 B2
(45) Date of Patent: Jul. 21, 2026

(54) COLD PLATE PLACEMENT AND RETRACTION APPARATUS WITH PREDEFINED TRAVEL PATHWAY

(71) Applicant: INTERNATIONAL BUSINESS MACHINES CORPORATION, Armonk, NY (US)

(72) Inventors: Madhana Sunder, Meridian, ID (US); Donald W. Porter, Highland, NY (US); Francis R. Krug, Jr., Highland, NY (US); Milnes P. David, New Paltz, NY (US); Jeffrey Allen Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 327 days.

(21) Appl. No.: 18/053,204

(22) Filed: Nov. 7, 2022

(65) Prior Publication Data

US 2024/0155796 A1     May 9, 2024

(51) Int. Cl.
H05K 7/14          (2006.01)
H05K 7/20          (2006.01)

(52) U.S. Cl.
CPC ......... H05K 7/1417 (2013.01); H05K 7/1401 (2013.01); H05K 7/20254 (2013.01); H05K 7/20636 (2013.01)

(58) Field of Classification Search
CPC .............. H05K 7/1417; H05K 7/1401; H05K 7/20254; H05K 7/20636; H05K 7/20772; B25J 17/0266
See application file for complete search history.

(56) References Cited

U.S. PATENT DOCUMENTS 3,306,646  A  *   2/1967  Flora, Jr. ................. B66C 1/427
                                                  294/81.61
6,039,374  A  *   3/2000  Klein ........................ B66C 1/66
                                                  294/81.61

(Continued)

FOREIGN PATENT DOCUMENTS

CN          109673129 A       4/2019
CN          114564094 A       5/2022

(Continued)

OTHER PUBLICATIONS

Screen capture from YouTube video clip entitled, "Pick and place mechanism 14," 1 page, uploaded on Mar. 24, 2022 by user "thang010146". Retrieve from Internet on Aug. 9, 2022: https://www.youtube.com/watch?v=k8uKN5xc0C0.

(Continued)

*Primary Examiner* — Stephen A Vu
(74) *Attorney, Agent, or Firm* — Kimberly Zillig

(57)          ABSTRACT
An apparatus that includes a plurality of linkage arms connected one to another by one of a plurality of joints, wherein the plurality of linkage arms has a first end and a second end, and the first end is adapted to allow for removable attachment of a cold plate from a cooling assembly in a computer server, and a coupling that reversibly connects the second end of the plurality of linkage arms to a location on the cooling assembly, wherein the coupling is adapted to allow the plurality of linkage arms to be held in place at the location on the cooling assembly. The plurality of linkage arms are adapted to move along a predefined travel pathway and adapted to be reversibly converted between at least a lowered configuration and a service configuration.

12 Claims, 14 Drawing Sheets

100

(56) References Cited

U.S. PATENT DOCUMENTS

| | | | | |
|---|---|---|---|---|
| 8,714,903 B2 * | 5/2014 | Feng | .................... | B25J 15/0616 |
| | | | | 414/735 |
| 9,737,985 B2 * | 8/2017 | Wu | ........................ | B25J 9/0051 |
| 10,371,317 B2 | 8/2019 | Chen | | |
| 10,919,143 B2 * | 2/2021 | Nakagawa | ............. | B25J 9/0051 |
| 11,148,295 B2 | 10/2021 | Correll | | |
| 2006/0196299 A1 | 9/2006 | Taboada | | |

FOREIGN PATENT DOCUMENTS

| | | |
|---|---|---|
| DE | 202014004067 U1 | 5/2014 |
| KR | 20160020137 A | 2/2016 |

OTHER PUBLICATIONS

Swing-arm tapping machine/electronic/brushless/electric. Tapping Machine. RTM Industry. https://ritmindustry.com/catalog/tapping-machines/swing-arm-tapping-machine-electronic-brushless-electric/. Retrieved from the internet on Aug. 9, 2022. 1 page.
Torralba, M., Hastings, D. J., Thousand, J. D., Nowakowski, B. K., & Smith, S. T. (Oct. 2015). A three-fingered, touch-sensitive, metrological micro-robotic assembly tool. Measurement Science and Technology, 26(12), 125902. See highlighted sections.

* cited by examiner

302

303

120

116

118

119

500

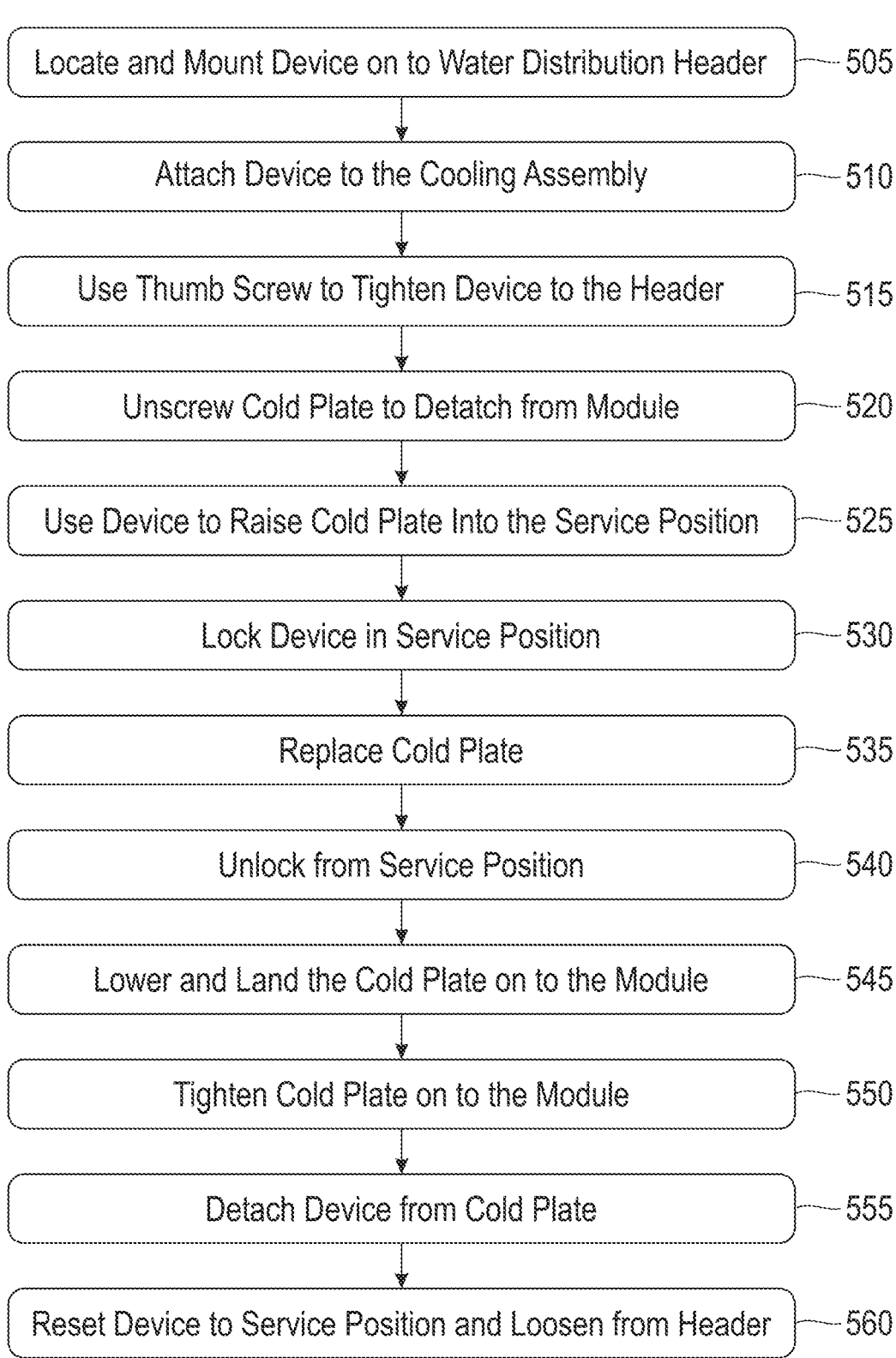

Locate and Mount Device on to Water Distribution Header — 505

Attach Device to the Cooling Assembly — 510

Use Thumb Screw to Tighten Device to the Header — 515

Unscrew Cold Plate to Detatch from Module — 520

Use Device to Raise Cold Plate Into the Service Position — 525

Lock Device in Service Position — 530

Replace Cold Plate — 535

Unlock from Service Position — 540

Lower and Land the Cold Plate on to the Module — 545

Tighten Cold Plate on to the Module — 550

Detach Device from Cold Plate — 555

Reset Device to Service Position and Loosen from Header — 560

FIG. 10

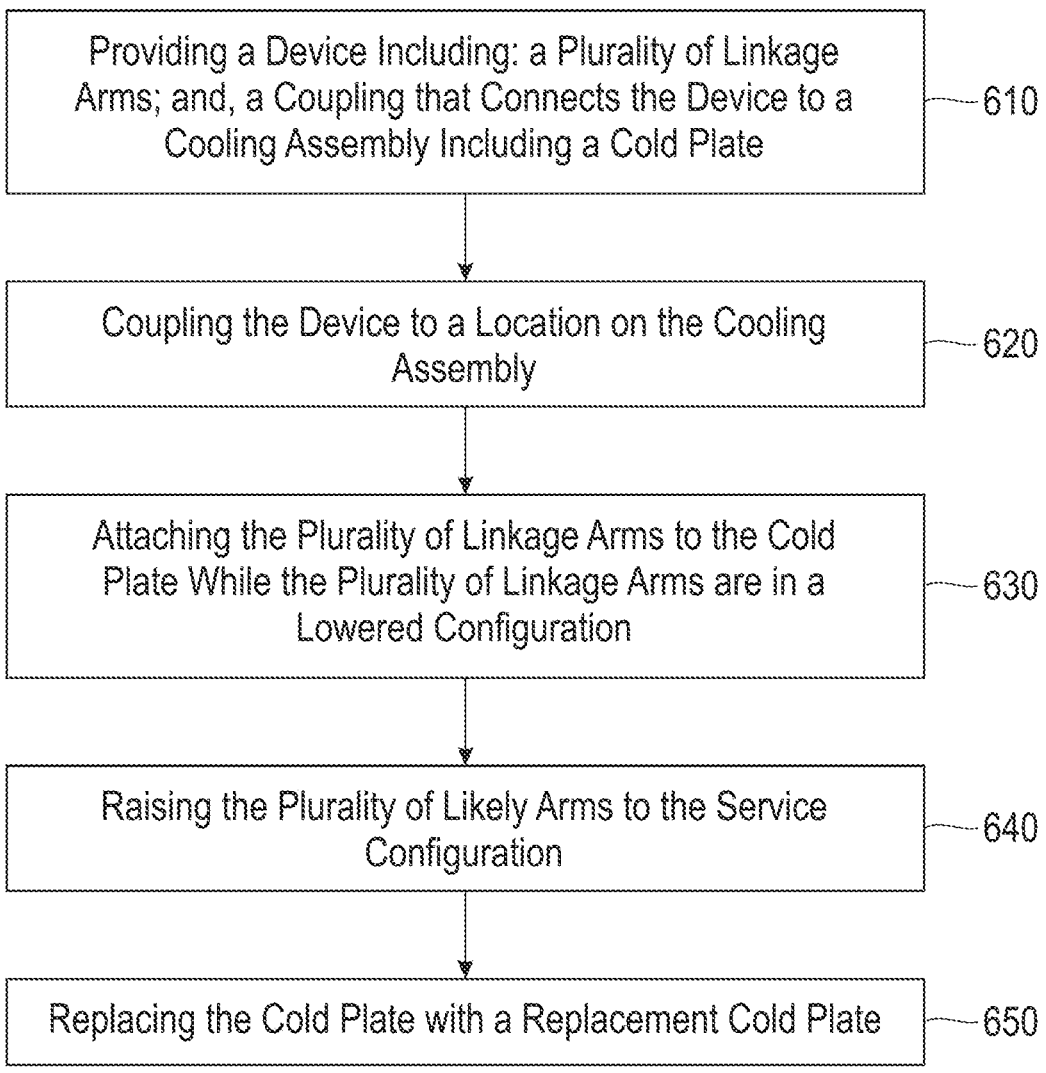

600

| | |
|---|---|
| Providing a Device Including: a Plurality of Linkage Arms; and, a Coupling that Connects the Device to a Cooling Assembly Including a Cold Plate | —610 |
| Coupling the Device to a Location on the Cooling Assembly | —620 |
| Attaching the Plurality of Linkage Arms to the Cold Plate While the Plurality of Linkage Arms are in a Lowered Configuration | —630 |
| Raising the Plurality of Likely Arms to the Service Configuration | —640 |
| Replacing the Cold Plate with a Replacement Cold Plate | —650 |

FIG. 11

COLD PLATE PLACEMENT AND RETRACTION APPARATUS WITH PREDEFINED TRAVEL PATHWAY

BACKGROUND

The present disclosure relates generally to systems and methods of cooling heat generating components of a computer server or other systems that operate in an enclosed data processing environment, and more particularly to a cold plate placement and retraction tool with a predefined travel pathway.

Electronic systems, such as, for example, computer systems, include several integrated circuit (IC) devices that generate heat during operation. For effective operation of the computer system, the temperature of the IC devices has to be maintained within acceptable limits. While the problem of heat removal from IC devices is an old one, this problem has increased in recent years due to greater numbers of transistors that are packed into a single IC device while reducing the physical size of the device. Increasing numbers of transistors compacted into a smaller area results in a greater concentration of heat that must be removed from that smaller area. Bundling multiple computer systems together, such as, for example, in a computer server, further aggravates the heat removal problem by increasing the amount of heat that has to be removed from a relatively small area.

SUMMARY

According to some embodiments of the disclosure, there is provided an apparatus. The apparatus includes a plurality of linkage arms connected one to another by one of a plurality of joints, wherein the plurality of linkage arms has a first end and a second end, and the first end is adapted to allow for removable attachment of a cold plate from a cooling assembly in a computer server, and a coupling that reversibly connects the second end of the plurality of linkage arms to a location on the cooling assembly, wherein the coupling is adapted to allow the plurality of linkage arms to be held in place at the location on the cooling assembly. The plurality of linkage arms are adapted to move along a predefined travel pathway and adapted to be reversibly converted between at least: a lowered configuration in which the plurality of linkage arms in an arrangement adapted to allow the first end of the plurality of linkage arms to attach to the cold plate, and a service configuration in which the plurality of linkage arms are raised from the lowered configuration along the predefined travel pathway to an elongated arrangement adapted to allow the cold plate to extend away from the cooling assembly to allow for service actions on the cold plate.

According to some embodiments of the disclosure, there is provided an apparatus used for service actions on a cold plate in a cooling assembly of a computer server. The apparatus includes a clip assembly adapted to allow attachment of the apparatus to the cooling assembly, a plurality of linkage arms that are pivotally attached to each other in order to allow movement of the apparatus along a predefined travel pathway and pivotally attached to the clip assembly, and a cold plate arm adapted to be reversibly connected at a first end of the cold plate to the cold plate and pivotally connected at a second end of the cold plate arm to one of the plurality of linkage arms opposite the clip assembly. The apparatus is adapted to be in a lowered position in order to attach to the cold plate in the cooling assembly and adapted to be raised from the lowered position to a service position along the predefined travel pathway in order for the cold plate to be accessed and serviced.

According to some embodiments of the disclosure, there is provided a method. The method includes providing an apparatus including a plurality of linkage arms connected one to another by one of a plurality of joints, wherein the plurality of linkage arms has a first end and a second end, and the first end is adapted to allow for removable attachment of a cold plate from a cooling assembly in a computer server, and a coupling that reversibly connects the second end of the plurality of linkage arms to a location on the cooling assembly, wherein the coupling is adapted to allow the plurality of linkage arms to be held in place at the location on the cooling assembly. The plurality of linkage arms are adapted to move along a predefined travel pathway and adapted to be reversibly converted between at least: a lowered configuration in which the plurality of linkage arms in an arrangement adapted to allow the first end of the plurality of linkage arms to attach to the cold plate, and a service configuration in which the plurality of linkage arms are raised from the lowered configuration along the predefined travel pathway to an elongated arrangement adapted to allow the cold plate to extend away from the cooling assembly to allow for service actions on the cold plate. The method also includes coupling the apparatus to the location on the cooling assembly, attaching the first end of the plurality of linkage arms to the cold plate while the plurality of linkage arms is in the lowered configuration, raising the plurality of linkage arms from the lowered configuration to the service configuration, and replacing the cold plate with a replacement cold plate.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 10 illustrates a flow chart of a process of unloading a cold plate and loading a replacement cold plate onto a module in a computer server using the cold plate placement and/or retraction device of FIG. 1, in accordance with embodiments of the disclosure.

FIG. 11 illustrates a flow chart of a process of using the device of FIG. 1, in accordance with embodiments of the disclosure.

Figure 1:
FIG. 1 illustrates a schematic, perspective view of a cold plate placement and/or retraction device, in accordance with embodiments of the disclosure.
Figure 1:
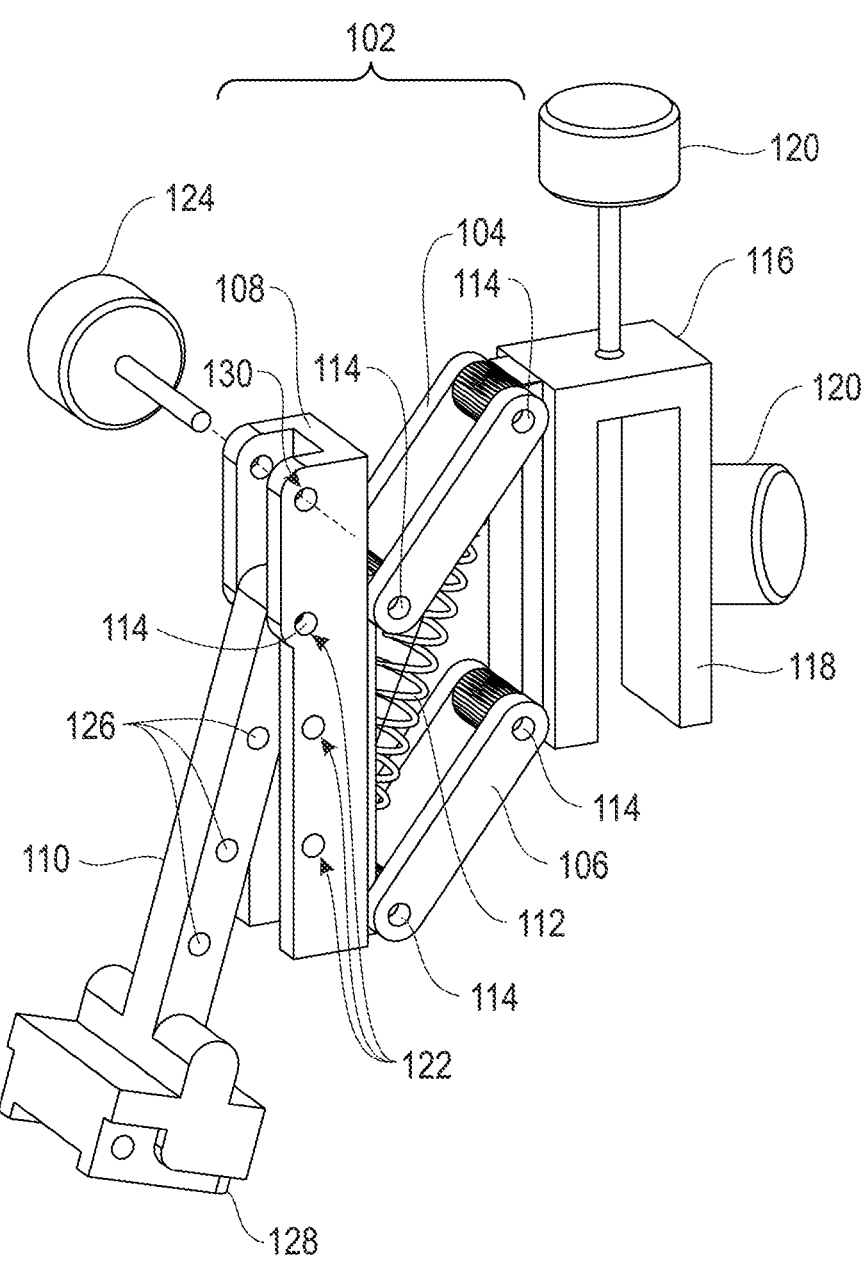

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Aspects of the present disclosure relate generally to systems and methods of cooling heat generating components of a computer server or other systems that operate in an enclosed data processing environment, and more particularly to a cold plate placement and retraction tool with a predefined travel pathway. While the present disclosure is not necessarily limited to such applications, various aspects of the disclosure can be appreciated through a discussion of various examples using this context.

In a typical computer server ("server"), multiple computer server modules ("modules") are stacked together in a rack or a case to consolidate network resources and minimize floor space. Modules, which are designed for use in a server configuration, are typically characterized by a motherboard comprising heat generating electronic components (such as integrated circuit (IC) devices) housed in a modular chassis or case, which in turn is mounted together with other similar modules, in a rack, drawer, blade cabinet, blade server, or other support structure. In practice, multiple servers (each comprising several modules) are typically located in an enclosed space such as a server room or a data center. During operation, the electronic components in the individual modules generate heat, which must be removed for effective functioning of the server.

In order to ensure normal operation of an electronic system, at least one cooling device is required, which can dissipate the heat of IC devices in the electronic system. One example of such a cooling device used to directly cool an IC device is a cold plate that can be placed in thermal contact (directly in contact, or in contact through a heat transfer medium, such as, for example, thermal grease or a thermal pad) with the IC device. Because of thermal contact, heat may be transferred from the IC device to the cold plate. A coolant can pass through the cold plate to remove heat from, and thereby cool, the IC device.

To date, manual loading practices, using multiple hands, are utilized for loading cold plates into computer server drawers. Cold plate manipulation has become a challenge due to, for example: space reduction brought upon by addition of mechanical components in the computer server drawers, increase in the size and weight of cold plate assemblies, stiffness of typical hose materials, and tighter tolerances in the placement of cold plates. Landing a cold plate in a controlled and consistent manner is important for unlidded modules or servers. It is essential that damage to the surfaces of cold plates and thermal interface materials be avoided when manipulating the cold plate into position or during retraction for service.

Embodiments of the present disclosure involve a manually operated device or apparatus that can be used for reliable and reproducible delivery and service actions on a cold plate assembly in a computer server (or computer server drawer), for example. The device can include locking assemblies for securing the device and for constraining cold plate motion. The device can include linear bearings or springs for dampening cold plate motion. The device can include alignment location lasers for proper placement. The device can also include integrated lighting for inspection purposes and, for example, for ultraviolet (UV) curing of thermal interface material that can be applied to a cold plate assembly. The manually operated device can be small, mobile, and reusable, and can include a field-detachable, linkage assembly. The linkage assembly can allow the manually operated device to be attached and used at multiple anchoring locations in a computer server drawer. The device can be adaptable for servicing multiple cold plate designs. For example, features in the linkage assembly can allow for different height hardware to be manipulated. The device can include features to prevent electrostatic discharge (ESD) events. For example, the device can include a conductive material, or a plastic material coated with a conductive material.

One feature or advantage of the disclosed device is that, from a reliability and quality perspective, the disclosed device enables the landing of a cold plate in a controlled, consistent and safe manner. Another feature or advantage of the disclosed device is that a cold plate can be manipulated or landed into a specific position single-handedly. Two or more hands are not necessary to load a cold plate into position using the device. Yet another feature or advantage of the disclosed device is that it provides predefined and reproducible loading and retraction paths for the cold plates and can be performed using a single local anchor point in a computer server drawer. As a result of a predefined path, unintentional contact of the device with other drawer hardware can be prevented. From a reliability and quality perspective, the device can enable landing of a cold plate in a controlled, consistent and safe manner. Yet a further advantage and feature of the disclosed device is to enable control of bend radius (i.e., away from natural bend radius of the hoses) connected to cold plate assemblies. Additionally, another advantage or feature is that the device occupies a small footprint. The device can also be reusable, field deployable, and can be removed from the computer server drawer when not in use.

Turning to the figures, FIG. 1 illustrates a schematic, perspective view of a cold plate placement and/or retraction device 100, in accordance with embodiments of the disclosure. The device 100 as shown includes a spring-loaded, four-bar linkage mechanism 102 that can be attached to and/or detached from a cold plate (not shown) positioned in a cooling assembly in a computer server (not shown). The linkage mechanism 102 allows the device 100 to be used for reliable and reproducible service of a cold plate in a computer module in a computer server using a single local anchoring point. The linkage mechanism 102 can include a first linkage arm 104, a second linkage arm 106, a third linkage arm (a.k.a., a pivot block) 108, a fourth linkage arm (a.k.a., a cold plate arm) 110, and a counterbalance spring 112. A plurality of pivot pins 114 can be used to pivotally attach the linkage arms 104, 106, 108, 110 of the linkage mechanism 102 as shown, for example. The use of pivot pins 114 are one example configuration of a joint formed between the plurality of linkage arms. Other suitable joints are also contemplated by the disclosure.

As shown, the first linkage arm 104 and the second linkage arm 106 can also be pivotally attached with pivot pins 114 to a clip assembly 116, which can include, for example, a u-shaped clip 118 and two adjustable thumb screws 120 directed in two different directions. The clip 118 can be adapted to allow the device 100 to be attached to another portion of a cooling assembly in a computer server at a local anchoring point. For example, the device 100 can be attached to a water distribution header or other portion of a cooling assembly in a computer server (see FIG. 4 and discussion below). Other reversible attachment means, besides the clip assembly 116, are also contemplated by the present disclosure, and are not limited to that which is shown. The clip 118 can also be referred to as a "coupling" in the disclosure.

The cold plate arm 110 can be configured, at a first end, to attach and/or detach from a cold plate (not shown). The cold plate arm 110 includes a cold plate attachment portion 128. The cold plate 110 can be attached using, e.g., magnets, locking means, pins, etc., any suitable reversible attachment means. At a second end, the cold plate arm 110 can be pivotally attached, via a pivot pin 114, to the pivot block 108. The cold plate arm 110 can be attached at one of a plurality of height adjustment points 122, via one of the pivot pins 114, to the pivot block 108. The height adjustment points 122 allow the cold plate arm 110 to be moved and attached to different locations along a length of the pivot block 108 depending upon a desired cold plate loading height of the device 100. The pivot block 108 is shown configured such that the cold plate arm 110 can partially fit inside the u-shaped form of the pivot block 108.

The first and second linkage arms 104, 106 can be spaced apart as shown and can be pivotally attached to the clip assembly 116 on first ends of the first and second linkage arms 104, 106 by pivot pins 114. Second ends of the first and second linkage arms 104, 106 can be pivotally attached to the pivot block 108. This arrangement allows the pivot block 108 to be controllably moved by the movement of the first and second linkage arms 104, 106. Between the first and second linkage arms 104, 106, the counterbalance spring 112 can be arranged diagonally therebetween. The counterbalance spring 112 can act as a damping mechanism or linear bearing mechanism that can be employed to gently lower a cold plate to its final position using the device 100. Other suitable means for providing a damping mechanism or linear bearing mechanism to the device 100 are contemplated by the disclosure and are not limited to the counterbalance spring 112 as shown.

The clip assembly 116 shown is an example of a means for attaching the device 100 to other structure. The clip assembly 116 enables attachment of the device 100 to various points of a given cooling assembly, for example. The adjustable thumb screws 120 can be provided for securing the device 100 to a specific cold plate loading position. Attachment can be used to prevent accidental motion of the device 100 during cold plate attachment and/or detachment operations.

The device 100 can include a locking assembly 124 that can be used to immobilize motion of the device 100 following cold plate retraction into a service position (see, e.g., FIG. 2C and description below). When the device 100 is in the service position (or configuration) the plurality of linkage arms can be in an elongated arrangement adapted to allow an attached cold plate to extend away from the cooling assembly to allow for service actions on the cold plate. Immobilization of the device 100 in the service position can prevent accidental lowering of a cold plate into the computer server drawer, for example, during service, which could result in possible damage to the cold plate and/or computer server drawer hardware. The locking assembly 124 shown is an adjustable thumb screw that can attach the cold plate arm 110 and the pivot block 108 by extending through both a locking assembly opening 130 and one of a plurality of cold plate arm openings 126. Other means for locking the device 100 in the service position, however, are also contemplated by the disclosure.

Figure 2A:
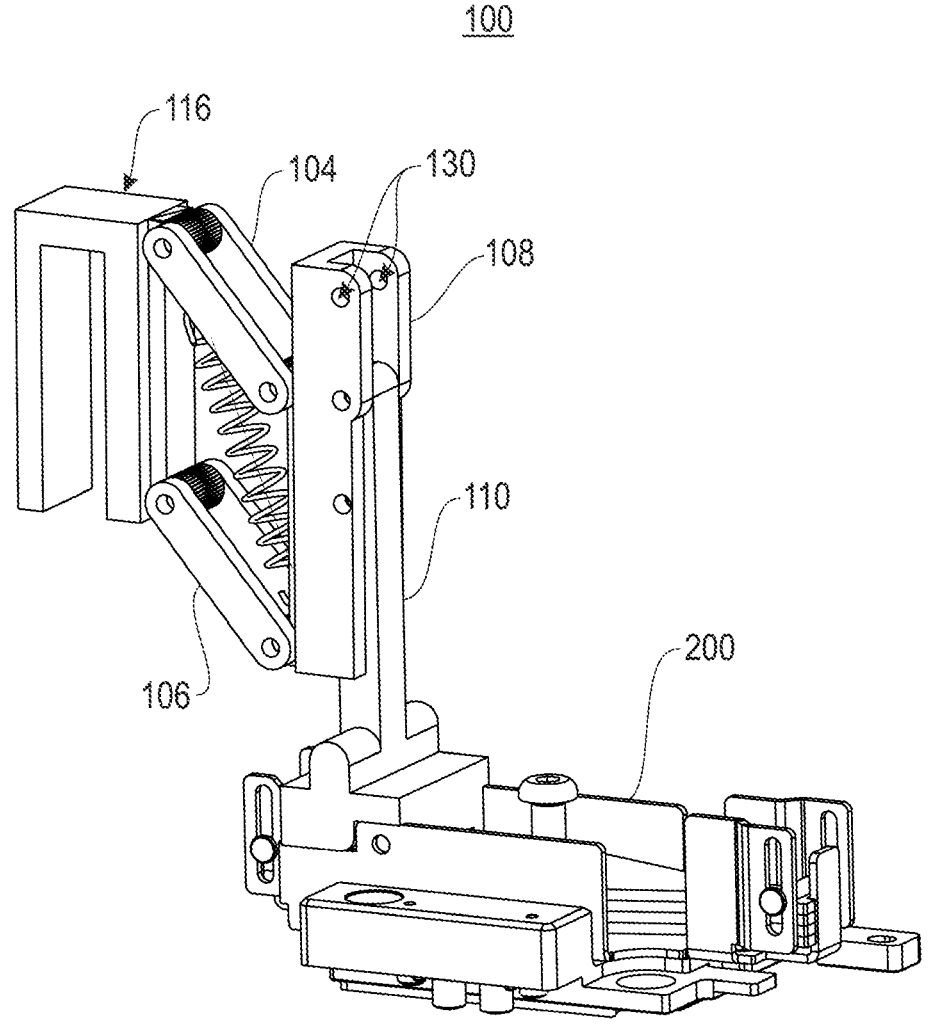
FIGS. 2A-2C illustrate schematic, perspective views of the device of FIG. 1 in a series of operations of a process involving the device, in accordance with embodiments of the disclosure.
Figure 2B:
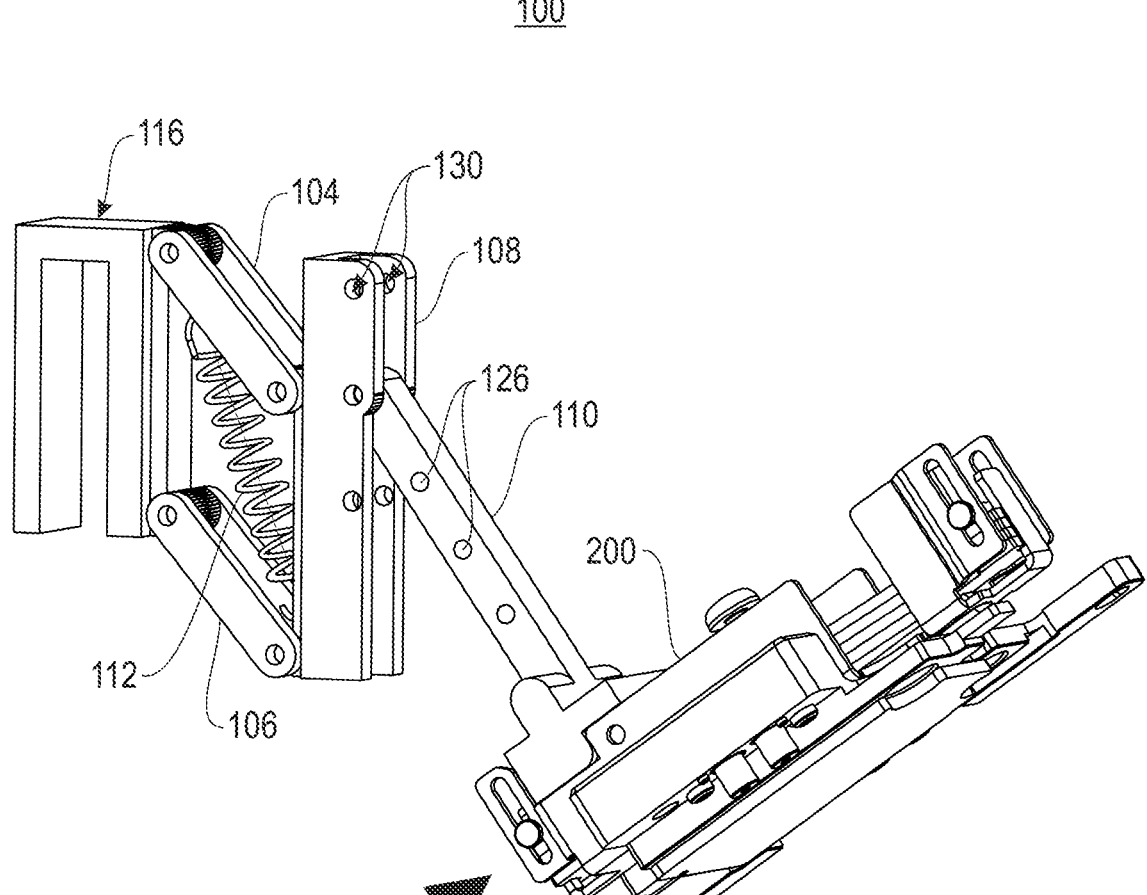
Figure 2C:
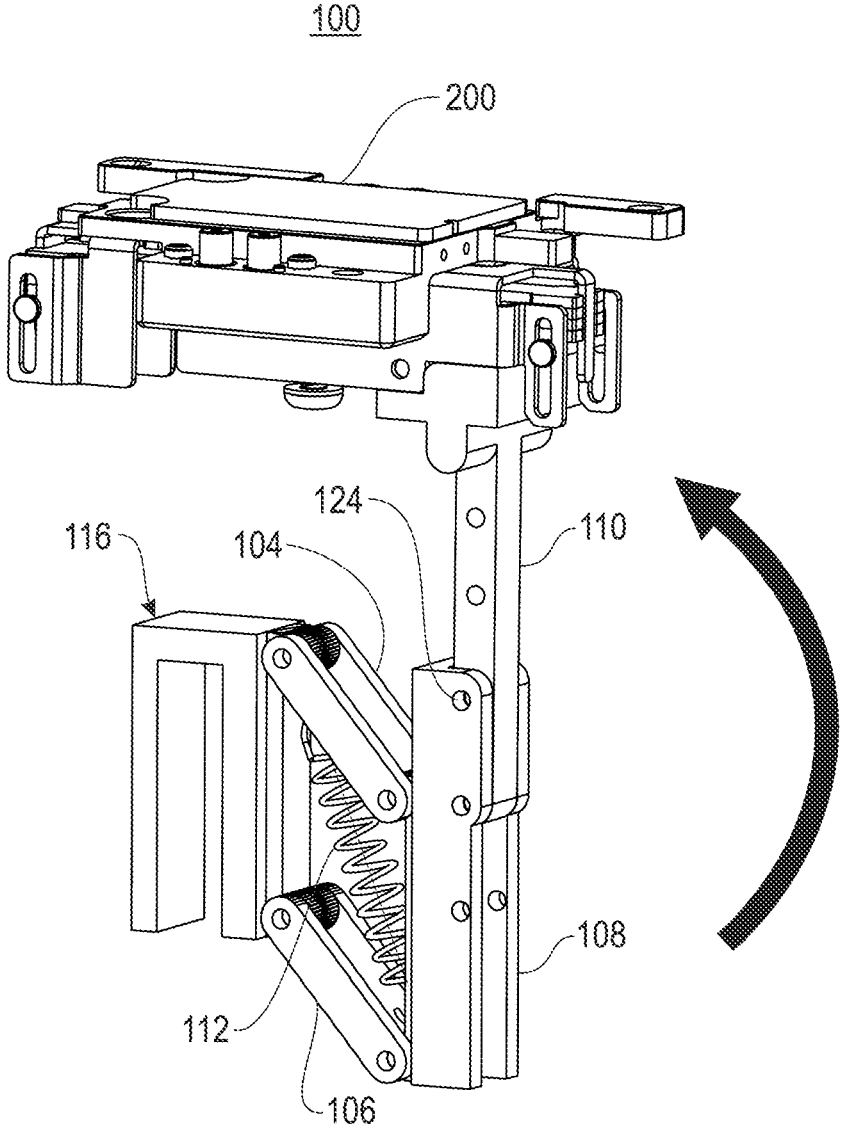

FIGS. 2A-2C illustrate schematic, perspective views of the device 100 in a series of operations of a process involving the device 100, in accordance with embodiments of the disclosure. The device 100 can begin in a lowered position (or configuration), as shown in FIG. 2A, and can be attached to a cold plate 200. In the lowered position, the cold plate 200 can still be attached to a module in a server (not shown). After detaching the cold plate 200 from the module, for example, the device 100 can begin to be raised upwardly, as shown in FIG. 2B. The device 100 can be raised by an operator's hand or by a tool being used by the operator. Other suitable ways for moving the device 100 up and down are also contemplated by the disclosure. The first and second linkage arms 104, 106, the pivot block 108 and the cold plate arm 110 can all be raised upwardly (in FIG. 2B) towards a service position, which is shown in FIG. 2C. The cold plate arm 110 and the cold plate 200 are both inverted in the service position as compared to their position in FIG. 2A, for example. As shown, the locking assembly 124 can then be inserted through openings (such as the lock assembly opening 130 and the cold plate arm opening 126 as visible in FIGS. 1, 2A and 2B) in order to hold the device 100 in the service position while work can be done on the cold plate 200. In particular, the cold plate arm 110 can be immovably attached to the pivot block 108 by the locking assembly 124.

In at least some embodiments, the device 100 can provide a proper ground path to land grid array (LGA) hardware and can help to eliminate ESD events. ESD can be important for 7 nanometer (nm), for example, and future generations of cold plates. In at least some embodiments, the device 100 can be constructed out of conductive material. In still other embodiments, a plastic material coated with a conductive material can be utilized for construction of the device 100. Other suitable materials for construction of the device 100 are also contemplated by the disclosure.

Figure 3:
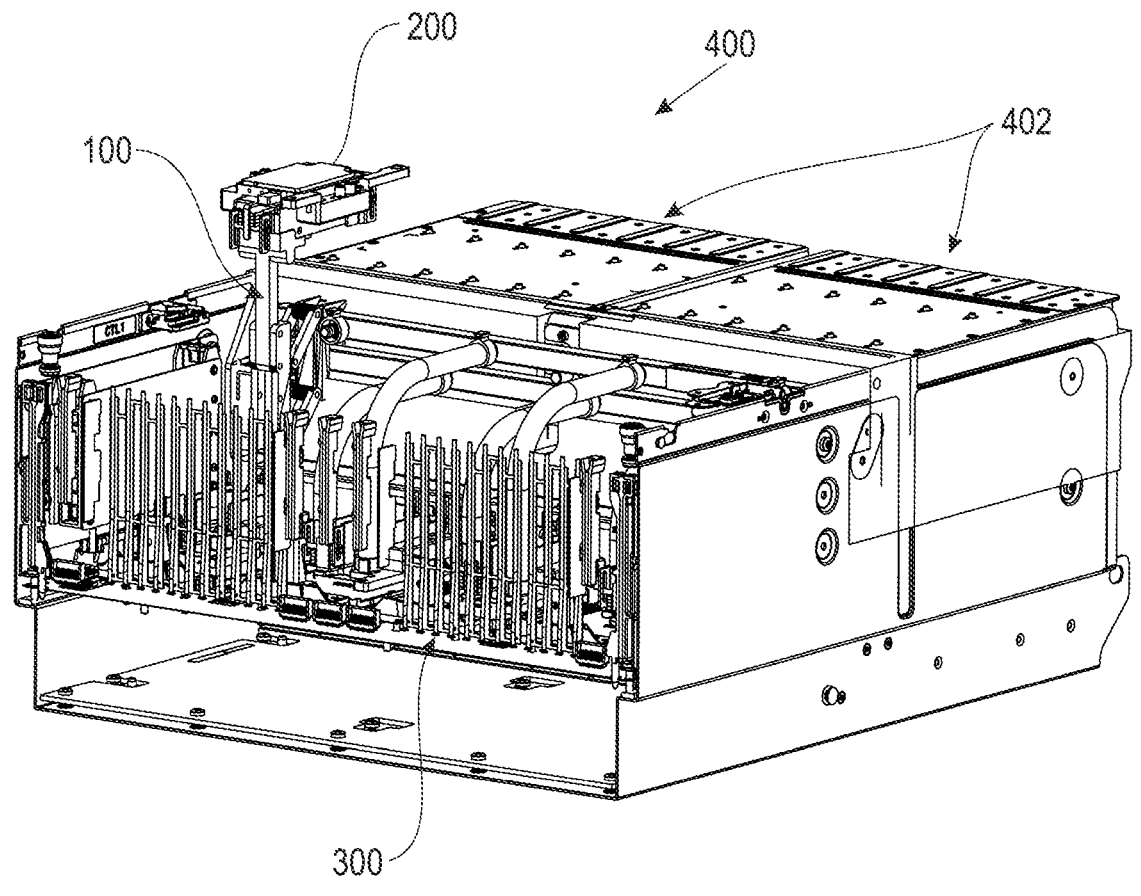
FIG. 3 illustrates a schematic, perspective view of the device of FIG. 1 in a computer server (or computer server drawer) and configured to service a cold plate in a cooling assembly, in accordance with embodiments of the disclosure.

FIG. 3 is a schematic, perspective view illustrating the device 100 in a computer server drawer 400, that includes a plurality (four (4) are shown) of modules 402, which is configured to service a cold plate 200 of a cooling assembly 300, in accordance with embodiments of the disclosure. Each of the modules 402 can include one of the cooling assemblies 300 configured to directly cool one or more electronic devices of each of the modules 402. To directly cool an electronic device, one of the cold plates 200 of the cooling assembly 300 can be placed in thermal contact (directly in contact, or in contact through a heat transfer medium, such as, for example, thermal grease or a thermal pad) with the electronic device. Because of thermal contact, heat may be transferred from the electronic device to the cold plate 200. A coolant (not shown) of the cooling assembly 300 may pass through the cold plate 200 to remove heat from, and thereby cool, the electronic device(s). As will be described in more detail below, conduits, such as hoses, can deliver the coolant to the cold plate 200 and can couple the coolant to a suitable heat exchanger. In some embodiments, the cooling assembly 300 can also include pumps or other liquid-moving devices (not shown) to assist in transferring the coolant to and from the cold plate 200. Alternatively, some configurations of the cooling assembly 300 may not include a pump, and instead, may rely upon the expansion and contraction of the coolant as it absorbs and dissipates heat to propel the coolant to and from the cold plate 200. Any liquid, such as, for example, water, alcohol, mixtures of alcohol and water, etc. may be used as the coolant. It should also be appreciated that the coolant can include a dielectric fluid incapable of conducting electricity. Using the dielectric fluid may therefore prevent damage to the components of module 402, including electronic devices, if a leak in the cooling assembly 300 were to occur in module 402. Non-limiting examples of such dielectric fluids can include deionized water, mineral oils, and mixtures thereof. Such dielectric fluids may also be fluorescent. Although the coolant is described as a liquid, in some embodiments, a phase change material may be used as the coolant. In these embodiments, a coolant in a liquid phase may transform to a gaseous phase after absorption of heat at the cold plate 200. The coolant may transform back to the liquid phase after transferring the absorbed heat from the cold plate 200. In some embodiments, valves or other known fluid control devices (not shown) may be provided in the cooling assembly 300 to control the flow of the coolant therein. Any type of cold plate 200 configured to transfer heat from the electronic device to the coolant circulating within the cooling assembly 300 can be used as the cold plate 200. The cold plate 200 can include fins, pins, or other such features to assist in transferring the heat from the cold plate 200 to the coolant.

In FIG. 3, the device 100 is shown in a service position, such as in FIG. 2C, within one module 402 (with a lid removed) of the computer server drawer 400. The cold plate 200 can extend above the computer server drawer 400 in the service position and can be serviced without contacting, and possibly damaging, other components of the cooling assembly 300 and/or the computer server drawer 400.

Figure 4:
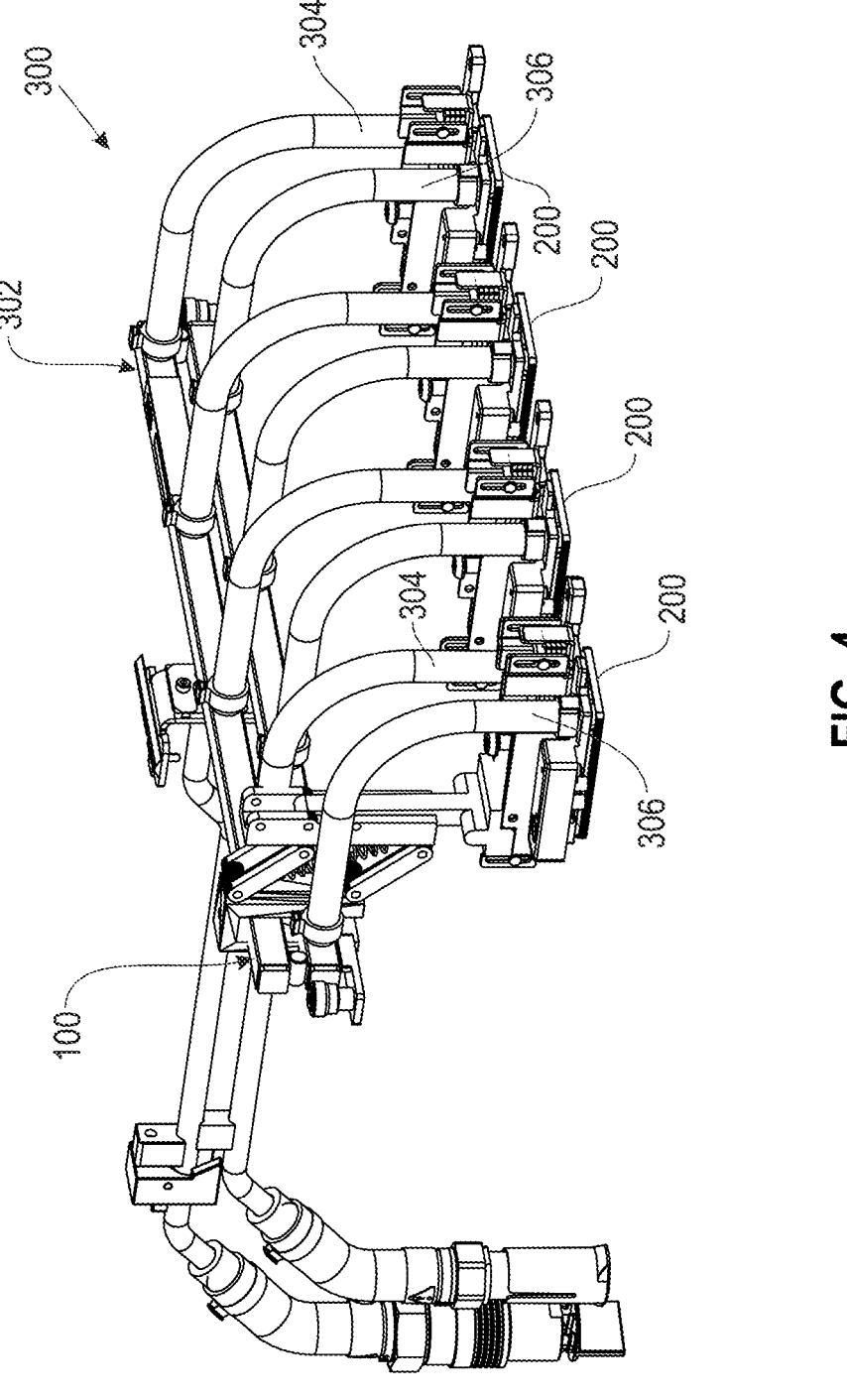
FIG. 4 illustrates a schematic, perspective view of the cooling assembly in FIG. 3, with the device of FIG. 1 attached, in accordance with embodiments of the disclosure.

FIG. 4 is a schematic, perspective view illustrating the cooling assembly 300, such as in FIG. 3, with the device 100 of FIG. 1 attached, in accordance with embodiments of the disclosure. The cooling assembly 300 can be attached to, and can cool, a plurality of cold plates 200. As shown, the cooling assembly 300 is attached to four (4) cold plates 200, but other suitable numbers of cold plates 200 are also contemplated. A cooling fluid can be supplied to the cold plates 200 by running the fluid to the cold plates 200 through inflow hoses 304 extending from a water distribution header 302 distributing fluid from a fluid source (not shown). The fluid can then flow or run back to the fluid source from the cold plates 200 through outflow hoses 306 connected to, and leading back to, the water distribution header 302. Heat can be dissipated from the cold plates 200 through the fluid running within the hoses 304, 306. The device 100 is shown located attached above one cold plate 200 and between the inflow hose 304 and outflow hose 306 attached to that particular cold plate 200. The device 100 can be attached to the water distribution header 302 at one end and the cold plate 200 at another end in order to move the cold plate 200 on a predefined travel pathway to a service position in order to be serviced as needed.

Figure 5A:
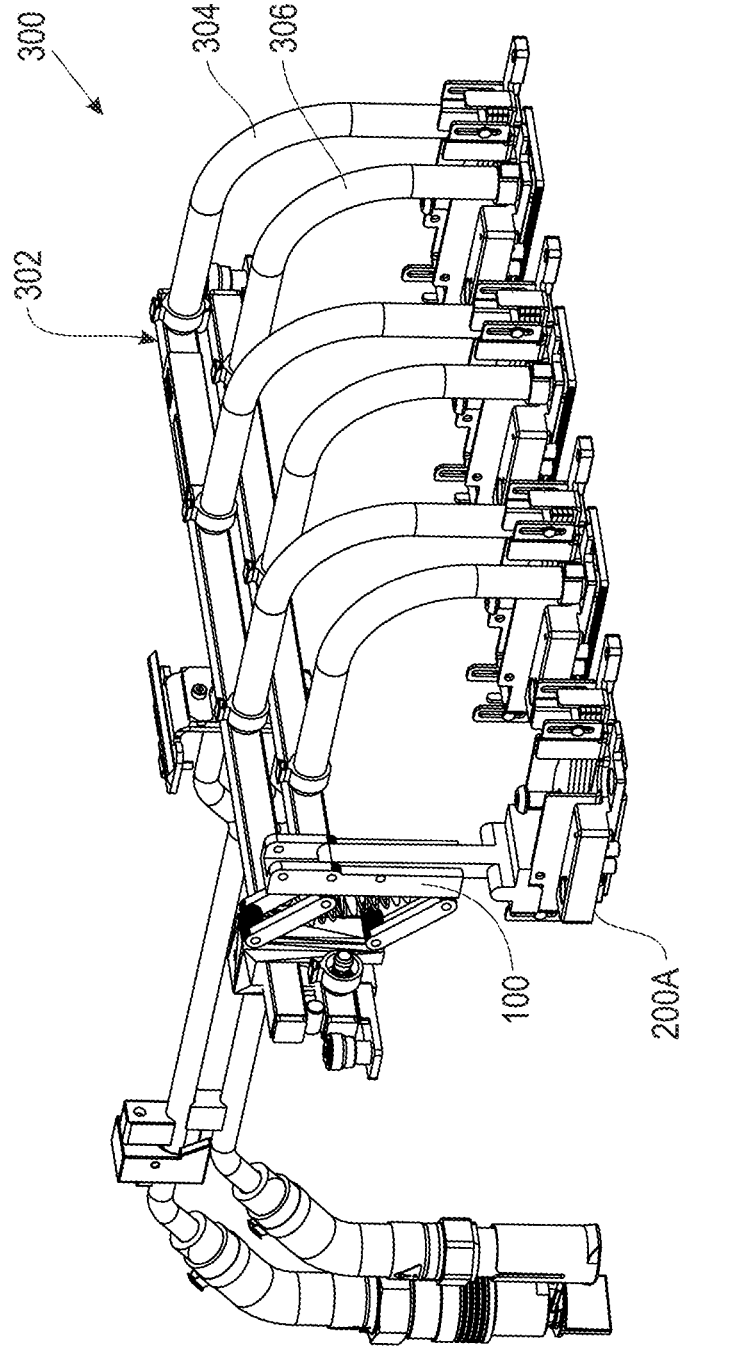
FIGS. 5A-5C illustrate schematic, perspective views of the cooling assembly of FIG. 4 with the device of FIG. 1 attached, in a series of operations of a process involving the device, in accordance with embodiments of the disclosure.
Figure 5B:
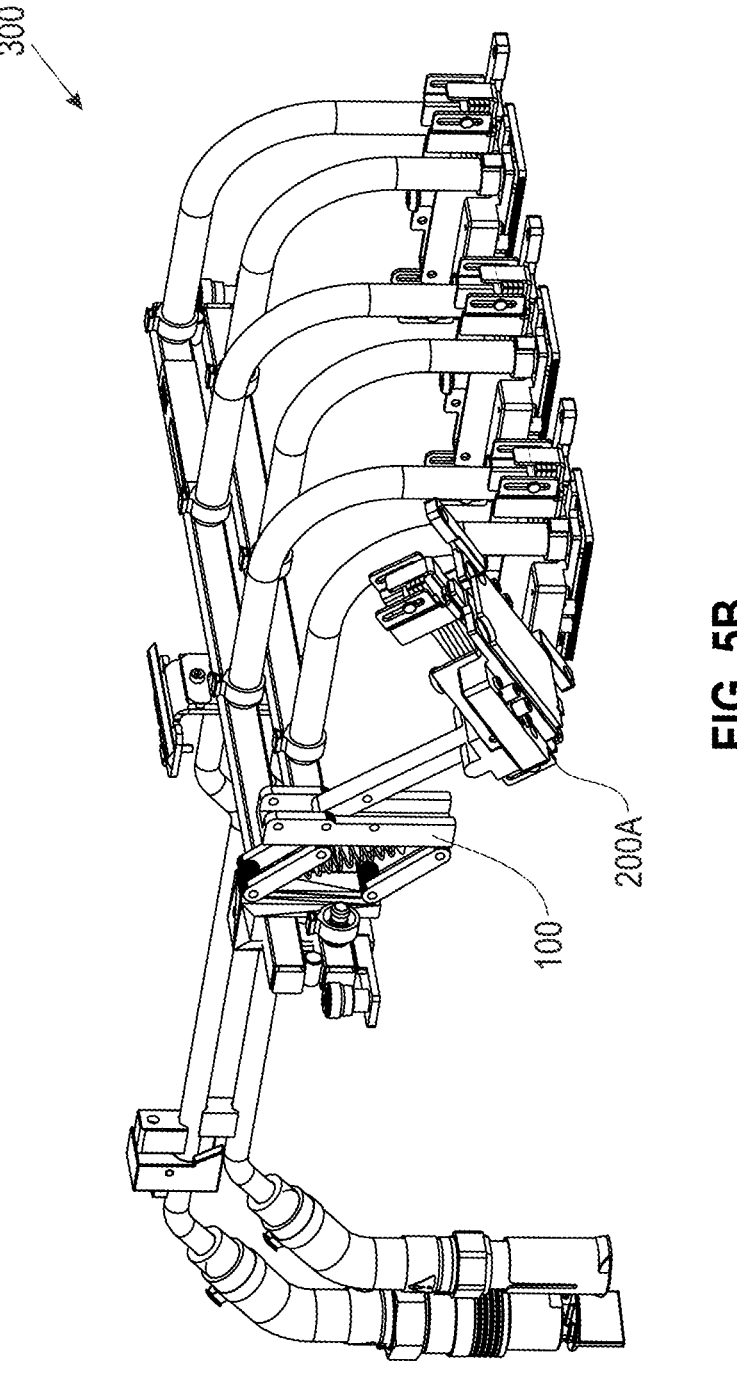
Figure 5C:
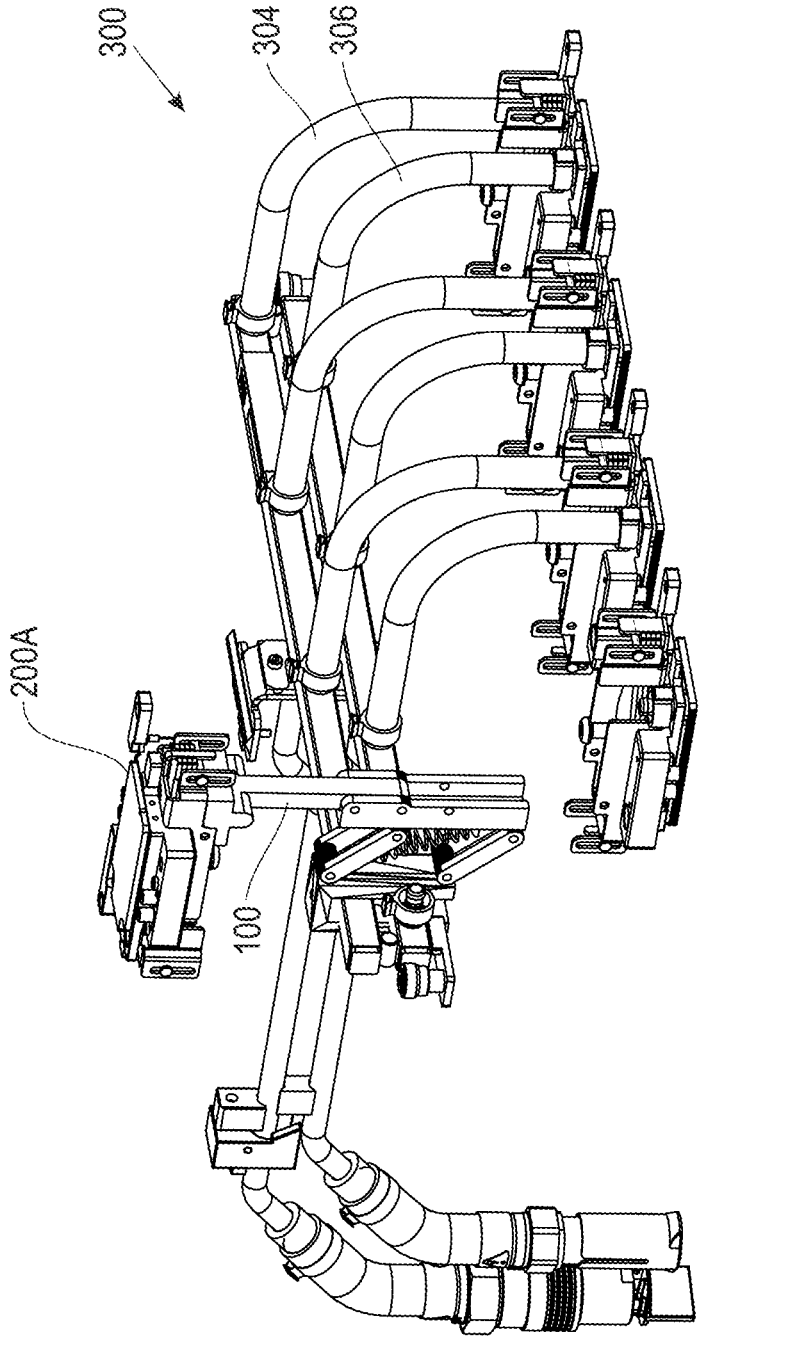

FIGS. 5A-5C illustrate schematic, perspective views of the cooling assembly 300 with the device 100 of FIG. 1 attached, in a series of operations of a process involving the device 100, in accordance with embodiments of the disclosure. FIG. 5A shows the cooling assembly 300 with the device 100 in a lowered position. For example, the device 100 can be attached to the cold plate 200A shown at one end and to the water distribution header 302 at another end. The inflow and outflow hoses 304, 306 are not shown attached to the cold plate 200A for viewing/clarity purposes only, but the hoses 304, 306 would be attached to the cold plate 200A of the cooling assembly 300 in normal operation.

FIG. 5B shows the device 100 as it is being raised towards a service position. FIG. 5C shows the cold plate 200A and device 100 locked in the service position. The cold plate 200A, for example, can be worked on in the service position or can be detached and exchanged for a different cold plate. FIGS. 5A-C show the travel pathway of the device 100 can be pre-defined and can avoid contact with other structures of the cooling assembly 300. As shown, the device 100 can be used when loading and/or unloading cold plates to/from the cooling assembly 300 of a computer server drawer. The device 100 can be removable and can be easily attached and/or detached to and/or from the water distribution header 302 at different locations. One (1) device 100 can be sufficient to be used in one (1) computer server drawer, for example. The device 100 can be field deployable.

Figure 6:
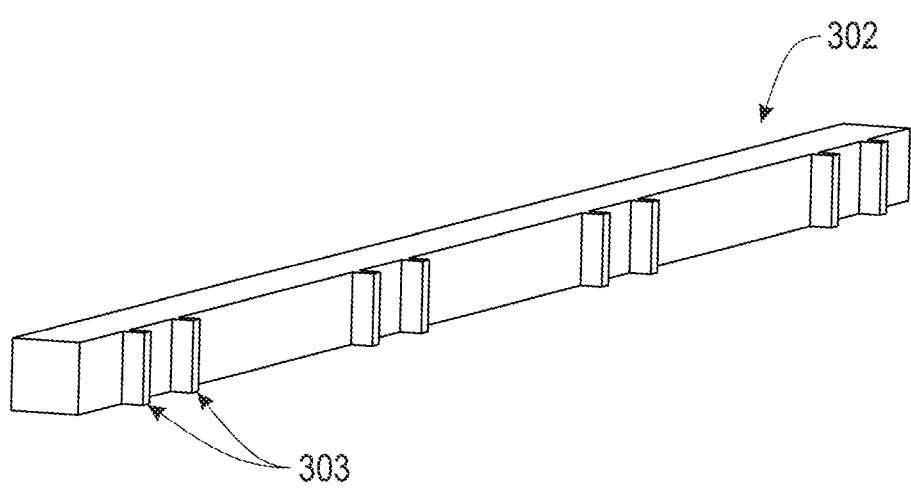
FIG. 6 illustrates a schematic, perspective view of a water distribution header of the cooling assembly of FIG. 4, in accordance with embodiments of the disclosure.

FIG. 6 illustrates a schematic, perspective view of the water distribution header 302 of the cooling assembly 300 of FIG. 4 and FIGS. 5A-5C, in accordance with embodiments of the disclosure. The view of the water distribution header 302 shows pairs of loading point markings 303 that can be used to determine attachment points for the device 100 (FIGS. 5A-5C) to the water distribution header 302. The device 100 can be attached to the water distribution header 302 between the pairs of loading point markings 303, for example, in order to access the cold plates 200 on the cooling assembly 300 (FIG. 4) through pre-defined travel pathways. Four (4) pairs of loading point markings 303 are shown, but other suitable numbers and positions are contemplated by the disclosure that can match the number of cold plates in a given cooling assembly.

Figure 7:
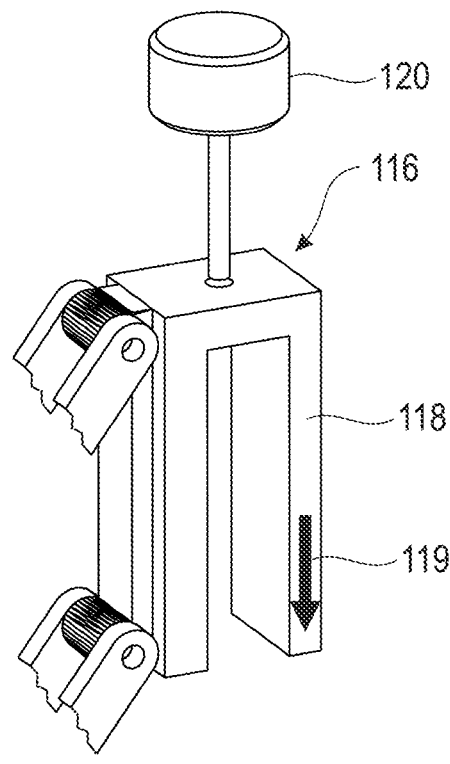
FIG. 7 illustrates a schematic, perspective view of a clip assembly portion of the device of FIG. 1, in accordance with embodiments of the disclosure.

FIG. 7 illustrates a schematic, perspective view of the clip assembly 116 of the device 100 of FIG. 1, in accordance with embodiments of the disclosure. The clip 118 of the clip assembly 116 can include at least one clip loading marking 119, as shown, that can be lined up with one of the loading point markings 303 on the water distribution header 302 (of FIG. 6). There can be another clip loading marking 119 on the other side of the clip 118, but not visible on FIG. 7. The line-up of the loading point markings 303 and the clip loading markings 119 (as in FIGS. 6 and 7) is one way in which the device 100 can be properly attached to the cooling assembly 300 as desired. Other suitable means for properly attaching the device 100 to the cooling assembly 300 at desired locations are also contemplated by the disclosure.

Figure 8A:
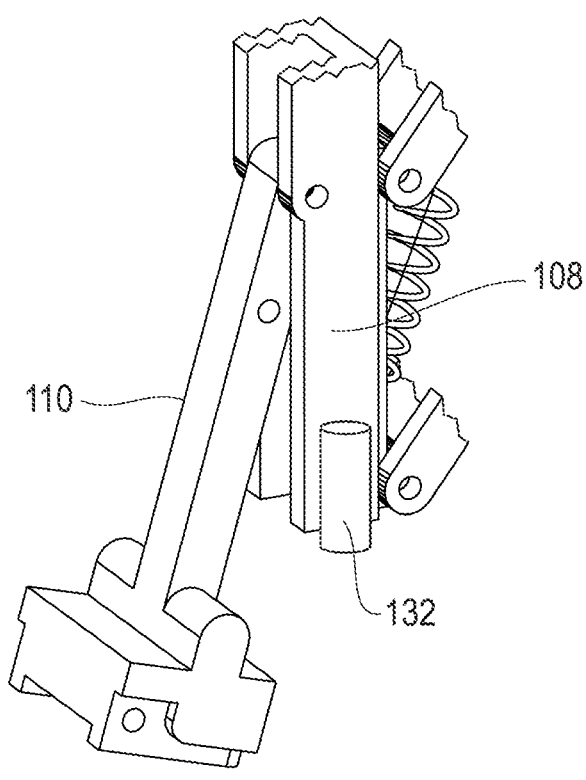
FIG. 8A illustrates a schematic, perspective view of a portion of the device of FIG. 1 with a laser attached, in accordance with embodiments of the disclosure.
Figure 8B:
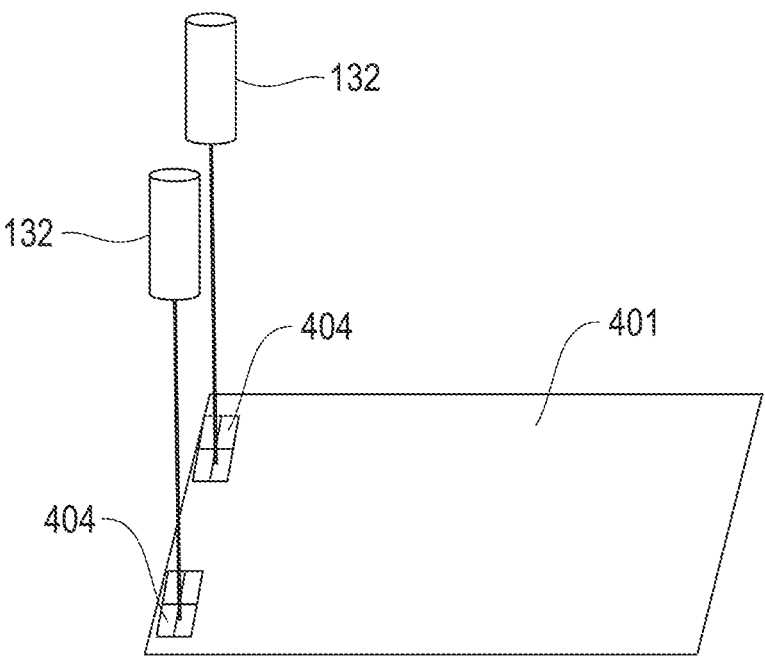
FIG. 8B illustrates a schematic, perspective view of a socket in the computer server of FIG. 3 and two of the lasers of FIG. 8A, in accordance with embodiments of the disclosure.

FIG. 8A illustrates a schematic, perspective view of a portion of the device of FIG. 1 with a laser 132 attached, and FIG. 8B illustrates a schematic, perspective view of a socket 402 in the computer server drawer (not shown) of FIG. 3, with two (2) of the lasers 132 of FIG. 8A shown (not shown attached to device 100), in accordance with embodiments of the disclosure. The figures together show another embodiment of using markings and lasers to enable the device 100 to be set into a proper or desired position to enable a cold plate to be serviced using the device 100 without contacting or damaging other components in the computer server drawer 400.

FIG. 8B shows a planar area (a socket) 401 that can be located on a floor of one module of the computer server drawer 400 (as in FIG. 3). The socket 401 can include dual, for example, loading point markers 404 that can be utilized to denote a center point for alignment with each laser 132 located on the device 100 (as in FIG. 8A). The lasers 132 on the device 100 can be lined up with center points (including, for example, a bull's eye or crosshairs) of the [laser] loading point markers 404 in order for the device 100 to be located in a desired location within the computer server drawer 400. The dual loading point markers 404 can be lined up equidistant from a center of the socket 401, for example. Each of the lasers 132 can be arranged perpendicular to their respective alignment loading point marker 404 within the device 100 when the device 100 is set in a service position, for example. During use of the device 100, the device 100 can be set into the service position and laterally adjusted on the water distribution header 302 (FIGS. 5A-C) until the dual lasers 132 reach the center points of the loading point markers 404 on the socket 401. Other suitable methods and components used to properly align the device 100 are also contemplated by the disclosure.

Figure 9:
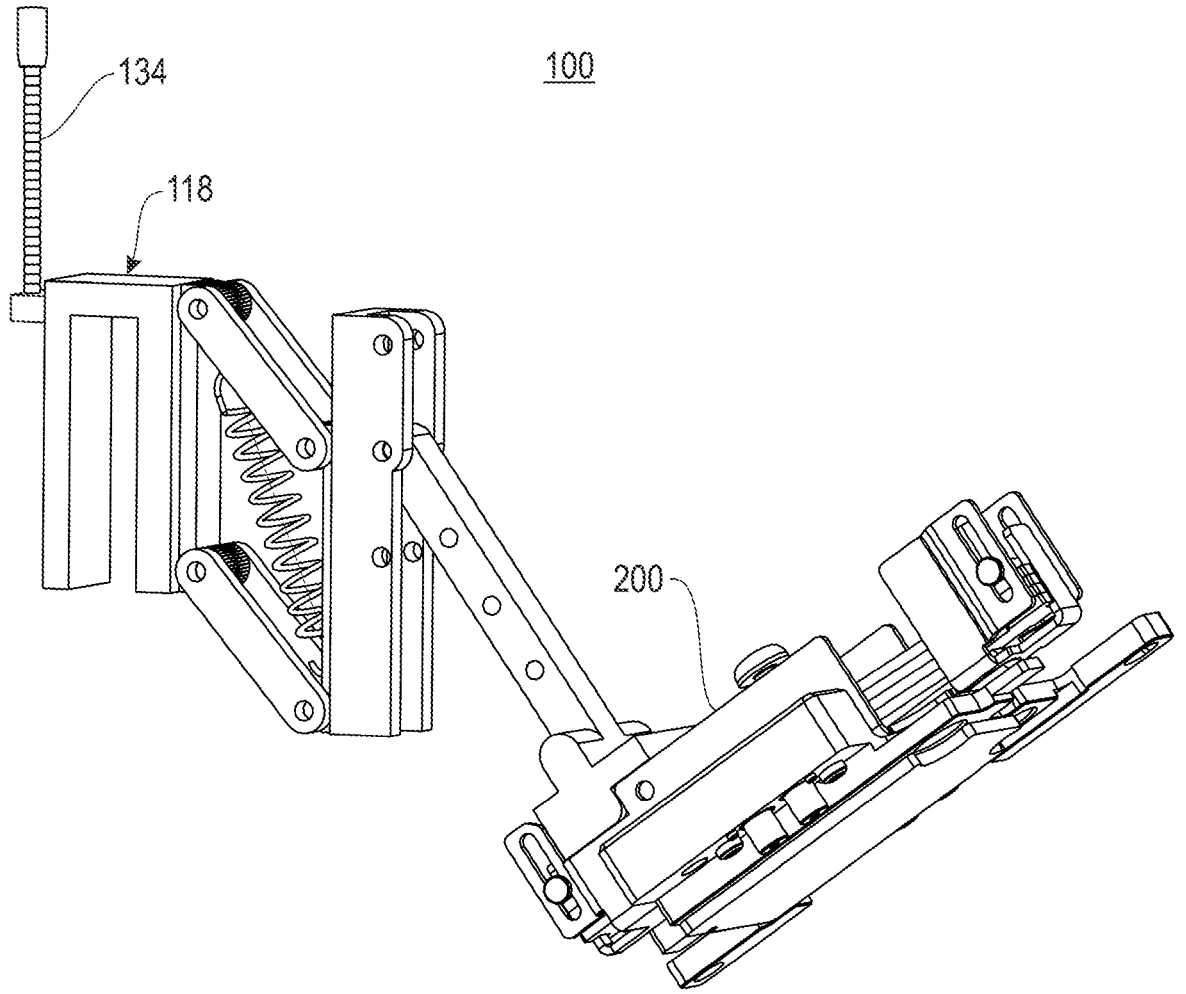
FIG. 9 illustrates a schematic, perspective view of a cold plate placement and/or retraction device including a light source and shown with a cold plate attached, in accordance with embodiments of the disclosure.

FIG. 9 illustrates a schematic, perspective view of a cold plate placement and/or retraction device 100 including a light source 134 and shown with a cold plate 200 attached, in accordance with embodiments of the disclosure. As shown, the light source 134 can be attached, for example, to the clip 118 of the device 100. The light source 134 can enable careful visual inspection of the cold plate 200 and its surfaces under low light conditions. In other embodiments, the light source 134 can be an ultraviolet (UV) light source that can be utilized to inspect a surface of the cold plate 200. Alternatively, a UV light source can be used to cure thermal interface material (TIM) on a cold plate. Other needs for inspection can include locating adhesive residue, cold plate damage, material curling, etc. In other embodiments, the light source 134 can be activated automatically once the device 100 enters the service position, for example. Other methods of improving visualization of the cold plate 200 and areas around the device 100 are also contemplated by the disclosure.

In some embodiments, the device 100 can be a manually operated device for reliable and reproducible service actions on a cold plate assembly. The device 100 can include locking assemblies (e.g., locking assembly 124) for securing the device 100 and for constraining cold plate motion. The device 100 can also include linear bearings or springs for dampening cold plate motion (e.g., the counterbalance spring 112). The device can include alignment location lasers (e.g., lasers 132). The device can also include integrated lighting for inspection or UV curing of TIM material (e.g., light source 134). The device 100 can include a small, mobile, field-detachable linkage assembly (e.g., linkage assembly 102) that can be removable and can be used in multiple anchoring locations in a cooling assembly (e.g., cooling assembly 300). The device 100 can be adaptable for servicing multiple cold plate designs. For example, features of the linkage assembly 102 allow for different height hardware to be manipulated by the device 100. The device

100 can include features that can help to prevent ESD events. For example, the device 100 can be made of a conductive material or a plastic material coated with a conductive material.

FIG. 10 illustrates a flow chart of a process 500 of unloading a cold plate 200 and loading a replacement cold plate onto a module in a computer server drawer 400 using the cold plate placement and retraction device 100 of FIG. 1, in accordance with embodiments of the disclosure. An operation 505 of the process is to locate and mount the device 100 on a water distribution header 302 of a cooling assembly 300 in the computer server drawer 400. Another operation 510 is to attach the device 100 to the cooling assembly 300, which can be done with another operation 515 of use of a thumb screw 120, for example, to tighten the device 100 to the water distribution header 302. A further operation 520 is to unscrew the cold plate 200 to detach the cold plate 200 from a module 402 in the computer server drawer 400. Another operation 525 is to use the device 100 to raise the device 100 and the cold plate 200 into a service position (see FIG. 2C for service position). An additional operation 530 is to lock the device 100 in the service position. Another operation 535 is to replace the cold plate 200 with a replacement cold plate. Yet another operation 540 is to unlock the device 100 from the service position. A further operation 545 is to lower the device 100 and land the replacement cold plate onto the module 402. Yet a further operation 550 is to tighten the replacement cold plate onto the module 402. Another operation 555 is to detach the device 100 from the replacement cold plate. An additional operation 560 is to reset the device 100 to a service position and loosen the device 100 from the water distribution header 302. The device 100 can be removed and can be moved to another position in the computer server drawer 400 to remove and replace another cold plate 200, for example.

FIG. 11 is a flow chart of a process 600 of using the device 100, in accordance with some embodiments. An operation 610 of the process is providing the device (100 in FIG. 1). The device 100 can include: a plurality of linkage arms (e.g., 104, 106, 108, and 110 in FIG. 1) connected one to another by one of a plurality of joints (e.g., including pins 114 in FIG. 1), wherein the plurality of linkage arms (e.g., 104, 106, 108, and 110 in FIG. 1) has a first end and a second end, and the first end is adapted to allow for removable attachment of a cold plate (e.g., 200 in FIG. 2A) from a cooling assembly (e.g., 300 in FIG. 4) in a computer server drawer (e.g., 400 in FIG. 3), and a coupling (e.g., 128 in FIG. 1) that reversibly connects the second end of the plurality of linkage arms (e.g., 104, 106, 108, and 110 in FIG. 1) to a location on the cooling assembly (e.g., 300 in FIG. 4), wherein the coupling (e.g., 128 in FIG. 1) is adapted to allow the plurality of linkage arms (e.g., 104, 106, 108, and 110 in FIG. 1) to be held in place at the location on the cooling assembly (e.g., 300 in FIG. 4). The plurality of linkage arms (e.g., 104, 106, 108, and 110 in FIG. 1) are adapted to move along a predefined travel pathway and adapted to be reversibly converted at least between the following configurations: a lowered configuration in which the plurality of linkage arms (e.g., 104, 106, 108, and 110 in FIG. 1) are in an arrangement adapted to allow the first end of the plurality of linkage arms (e.g., 104, 106, 108, and 110 in FIG. 1) to attach to the cold plate (e.g., 200 in FIG. 2A); and a service configuration in which the plurality of linkage arms (e.g., 104, 106, 108, and 110 in FIG. 1) are raised from the lowered configuration along the predefined travel pathway to an elongated arrangement adapted to allow the cold plate (e.g., 200 in FIG. 2A) to extend away from the cooling assembly (e.g., 300 in FIG. 4) to allow for service actions on the cold plate (e.g., 200 in FIG. 2A). Another operation 620 is coupling the device (e.g., 100 in FIG. 1) to the location on the cooling assembly (e.g., 300 in FIG. 4). A further operation 630 is attaching the first end of the plurality of linkage arms (e.g., 104, 106, 108, and 110 in FIG. 1) to the cold plate (e.g., 200 in FIG. 2A) while the plurality of linkage arms (e.g., 104, 106, 108, and 110 in FIG. 1) are in the lowered configuration. Yet another operation 640 is raising the plurality of linkage arms (e.g., 104, 106, 108, and 110 in FIG. 1) from the lowered configuration to the service configuration. Yet a further operation 650 is replacing the cold plate (e.g., 200 in FIG. 2A) with a replacement cold plate. After the replacing step, the process can further include operations of lowering the plurality of linkage arms (e.g., 104, 106, 108, and 110 in FIG. 1) from the service configuration to the lowered configuration, detaching the replacement cold plate from the device (e.g., 100 in FIG. 1), and placing the replacement cold plate in the cooling assembly (e.g., 300 in FIG. 4). The device (e.g., 100 in FIG. 1) can further include a locking assembly (e.g., 124 in FIG. 1) adapted to prevent the plurality of linkage arms (e.g., 104, 106, 108, and 110 in FIG. 1) from moving while the device (e.g., 100 in FIG. 1) is in the service position, and the process can further include an operation of locking the plurality of linkage arms (e.g., 104, 106, 108, and 110 in FIG. 1) using the locking assembly (e.g., 124 in FIG. 1) in the service configuration. After the placing step, the process can further include operations of de-coupling the device (e.g., 100 in FIG. 1) from the location on the cooling assembly (e.g., 300 in FIG. 4), and coupling the device (e.g., 100 in FIG. 1) to a second location on the cooling assembly (e.g., 300 in FIG. 4).

For purposes of description herein, the terms "upper," "lower," "top," "bottom," "left," "right," "rear," "front," "vertical," "horizontal," and derivatives thereof shall relate to the devices as oriented in the figures. However, it is to be understood that the devices can assume various alternative orientations and step sequences, except where expressly specified to the contrary. It is also to be understood that the specific devices and processes illustrated in the attached drawings, and described in the following disclosure, are simply exemplary embodiments of the inventive concepts defined in the appended claims. Hence, other physical characteristics relating to the embodiments disclosed herein are not to be considered as limiting, unless the claims expressly state otherwise.

For purposes of this description, certain aspects, advantages, and novel features of the embodiments of this disclosure are described herein. The disclosed processes, and systems should not be construed as being limiting in any way. Instead, the present disclosure is directed toward all novel and nonobvious features and aspects of the various disclosed embodiments, alone and in various combinations and sub-combinations with one another. The processes, and systems are not limited to any specific aspect or feature or combination thereof, nor do the disclosed embodiments require that any one or more specific advantages be present, or problems be solved.

Although the operations of some of the disclosed embodiments are described in a particular, sequential order for convenient presentation, it should be understood that this manner of description encompasses rearrangement, unless a particular ordering is required by specific language set forth below. For example, operations described sequentially can in some cases be rearranged or performed concurrently. Moreover, for the sake of simplicity, the attached figures may not show the various ways in which the disclosed processes can be used in conjunction with other processes. Additionally, the description sometimes uses terms like "provide" or "achieve" to describe the disclosed processes. These terms are high-level abstractions of the actual operations that are performed. The actual operations that correspond to these terms can vary depending on the particular implementation and are readily discernible by one of ordinary skill in the art.

As used in this application and in the claims, the singular forms "a," "an," and "the" include the plural forms unless the context clearly dictates otherwise. Additionally, the term "includes" means "comprises."

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. An apparatus comprising:
   a moveable arm assembly comprising a first linkage arm, a second linkage arm, and a third linkage arm, wherein the first linkage arm and the second linkage arm are pivotally connected by by-a first pivot pin and the second linkage arm and the third linkage arm are pivotally connected by a second pivot pin, the moveable arm assembly has a first end and a second end, and the first end is adapted to allow for removable attachment of a cold plate from a cooling assembly in a computer server; and
   a coupling that reversibly connects the second end of the moveable arm assembly to a location on the cooling assembly, wherein the coupling is adapted to allow the moveable arm assembly to be held in place at the location on the cooling assembly,
   wherein the moveable arm assembly is adapted to move along a predefined travel pathway and adapted to be reversibly converted between at least:
     a lowered configuration in which the moveable arm assembly is in an arrangement adapted to allow the first end of the moveable arm assembly to attach to the cold plate; and
     a service configuration in which the moveable arm assembly is raised from the lowered configuration along the predefined travel pathway to an elongated arrangement adapted to allow the cold plate to extend away from the cooling assembly to allow for service actions on the cold plate.

2. The apparatus of claim 1, wherein while the moveable arm assembly is in the service configuration, the cold plate can be detached from the apparatus and replaced with a replacement cold plate.

3. The apparatus of claim 1, further comprising:
   a locking assembly adapted to lock the moveable arm assembly and prevent the first linkage arm, the second linkage arm and the third linkage arm from moving while the apparatus is in the service configuration.

4. The apparatus of claim 1, further comprising:
   a counterbalance spring connected between at least two of the first linkage arm, the second linkage arm and the third linkage arm and adapted to dampen movement of the moveable arm assembly along the predefined travel pathway.

5. The apparatus of claim 1, further comprising:

a linear bearing connected between at least two of the first linkage arm, the second linkage arm and the third linkage arm and adapted to dampen movement of the moveable arm assembly along the predefined travel pathway.

6. The apparatus of claim 1, further comprising:

a light source attached to the apparatus.

7. The apparatus of claim 1, wherein at least one of the first linkage arm, the second linkage arm and the third linkage arm includes a plurality of height adjustment openings adapted to allow the moveable arm assembly to be attached in order to provide for different heights of the apparatus.

8. The apparatus of claim 1, wherein the apparatus is adapted to allow detachment of the coupling from the location on the cooling assembly and attachment of the coupling to a second location on the cooling assembly.

9. A method of using a cold plate placement and retraction apparatus, the method comprising:

providing the cold plate placement and retraction apparatus including a moveable arm assembly comprising a first linkage arm, a second linkage arm, and a third linkage arm, wherein the first linkage arm and the second linkage arm are pivotally connected by-a first pivot pin and the second linkage arm and the third linkage arm are pivotally connected by a second pivot pin, the moveable arm assembly has a first end and a second end, and the first end is adapted to allow for removable attachment of a cold plate from a cooling assembly in a computer server; and a coupling that reversibly connects the second end of the moveable arm assembly to a location on the cooling assembly, wherein the coupling is adapted to allow the moveable arm assembly to be held in place at the location on the cooling assembly, wherein the moveable arm assembly is adapted to move along a predefined travel pathway and adapted to be reversibly converted between at least:

a lowered configuration in which the moveable arm assembly is in an arrangement adapted to allow the first end of the moveable arm assembly to attach to the cold plate; and a service configuration in which the moveable arm assembly is raised from the lowered configuration along the predefined travel pathway to an elongated arrangement adapted to allow the cold plate to extend away from the cooling assembly to allow for service actions on the cold plate;

coupling the cold plate placement and retraction apparatus to the location on the cooling assembly;

attaching the first end of the moveable arm assembly to the cold plate while the moveable arm assembly is in the lowered configuration;

raising the moveable arm assembly from the lowered configuration to the service configuration; and replacing the cold plate with a replacement cold plate.

10. The method of claim 9, wherein after the replacing step, the method further comprising:

lowering the moveable arm assembly for the service configuration to the lowered configuration;

detaching the replacement cold plate from the cold plate placement and retraction apparatus; and placing the replacement cold plate in the cooling assembly.

11. The method of claim 10, wherein after the placing step, the method further comprising:

de-coupling the cold plate placement and retraction apparatus from the location on the cooling assembly; and coupling the cold plate placement and retraction apparatus to a second location on the cooling assembly.

12. The method of claim 9, wherein the cold plate placement and retraction apparatus further includes a locking assembly adapted to prevent the moveable arm assembly from moving while the cold plate placement and retraction apparatus is in the service configuration, the method further comprising:

locking the moveable arm assembly using the locking assembly in the service configuration.

* * * * *